United States Patent
Kim et al.

(10) Patent No.: US 10,735,225 B2
(45) Date of Patent: Aug. 4, 2020

(54) METHOD AND APPARATUS FOR TRANSMITTING AND RECEIVING SIGNAL FOR LOW PEAK-TO-AVERAGE POWER RATIO IN WIRELESS COMMUNICATION SYSTEM

(71) Applicant: Samsung Electronics Co., Ltd., Suwon-si, Gyeonggi-do (KR)

(72) Inventors: Chanhong Kim, Suwon-si (KR); Yeohun Yun, Hwaseong-si (KR); Yongok Kim, Seoul (KR); Jongbu Lim, Seoul (KR); Sungnam Hong, Suwon-si (KR); Taeyoung Kim, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 15/971,471

(22) Filed: May 4, 2018

(65) Prior Publication Data
US 2018/0324005 A1    Nov. 8, 2018

(30) Foreign Application Priority Data

May 4, 2017    (KR) .................. 10-2017-0057054
Aug. 24, 2017  (KR) .................. 10-2017-0107454

(51) Int. Cl.
*H03H 17/04*    (2006.01)
*H04L 25/03*    (2006.01)
(Continued)

(52) U.S. Cl.
CPC ....... *H04L 25/03834* (2013.01); *H03H 17/04* (2013.01); *H04L 5/0007* (2013.01);
(Continued)

(58) Field of Classification Search
CPC .................................................. H04L 25/03834
(Continued)

(56) References Cited

U.S. PATENT DOCUMENTS

| 7,206,350 B2* | 4/2007 | Korobkov | H04L 5/0037 370/208 |
| 2004/0076247 A1* | 4/2004 | Barak | H04L 27/2623 375/350 |

(Continued)

OTHER PUBLICATIONS

International Search Report dated Sep. 21, 2018, issued in International Application No. PCT/KR2018/005194.

*Primary Examiner* — Qutbuddin Ghulamali
(74) *Attorney, Agent, or Firm* — Jefferson IP Law, LLP (57) ABSTRACT

The present disclosure relates to a communication method and system for converging a 5G communication system for supporting higher data rates beyond a 4G system with an IoT technology. The present disclosure may be applied to intelligent services based on the 5G communication technology and the IoT-related technology, such as smart home, smart building, smart city, smart car, connected car, health care, digital education, smart retail, security and safety services. The present disclosure can reduces a peak-to-average power ration (PAPR) by performing time domain cyclic filtering. Further, a data rate or coverage can be improved by selectively transmitting transmission waveforms through cyclic prefix (CP)-orthogonal frequency division multiplexing (OFDM) or discrete Fourier transform-spread-OFDM (DFT-s-OFDM).

16 Claims, 5 Drawing Sheets

(51) Int. Cl.
*H04L 27/20* (2006.01)
*H04L 27/26* (2006.01)
*H04L 5/00* (2006.01)
*H04L 5/02* (2006.01)

(52) U.S. Cl.
CPC ...... *H04L 27/2035* (2013.01); *H04L 27/2614* (2013.01); *H04L 27/2634* (2013.01); *H04L 27/2636* (2013.01); *H04L 5/023* (2013.01)

(58) Field of Classification Search
USPC .................................................. 375/296, 260
See application file for complete search history.

(56)  References Cited

U.S. PATENT DOCUMENTS

| | | | | |
|---|---|---|---|---|
| 2007/0081604 | A1* | 4/2007 | Khan | H04L 25/03828 375/261 |
| 2008/0247487 | A1* | 10/2008 | Cai | H04L 27/2623 375/296 |
| 2011/0255627 | A1* | 10/2011 | Gotman | H04L 27/2624 375/285 |
| 2012/0051406 | A1* | 3/2012 | Jarosinski | G06F 17/15 375/214 |
| 2016/0094895 | A1 | 3/2016 | Stadelmeier et al. | |

* cited by examiner

METHOD AND APPARATUS FOR TRANSMITTING AND RECEIVING SIGNAL FOR LOW PEAK-TO-AVERAGE POWER RATIO IN WIRELESS COMMUNICATION SYSTEM

CROSS-REFERENCE TO RELATED APPLICATION(S)

This application is based on and claims priority under 35 U.S.C. § 119(a) of a Korean patent application number 10-2017-0057054, filed on May 4, 2017 in the Korean Intellectual Property Office, and under 35 U.S.C. § 119(a) of a Korean patent application number 10-2017-0107454, filed on Aug. 24, 2017, in the Korean Intellectual Property Office, the disclosure of each of which is incorporated by reference herein in its entirety.

BACKGROUND

1. Field

The disclosure relates to a wireless communication system. More particularly, the disclosure relates to an apparatus and a method for a low peak-to-average power ratio in a wireless communication system.

2. Description of the Related Art

In order to meet the demand for wireless data traffic that is on an increasing trend after commercialization of $4^{th}$ generation (4G) communication systems, efforts have been made to develop improved $5^{th}$ generation (5G) or pre-5G communication system. For this reason, the 5G or pre-5G communication system is also called a beyond 4G network communication system or a post long term evolution (LTE) system. In order to achieve high data rate, implementation of a 5G communication system in an ultrahigh frequency (mmWave) band (e.g., like 60 GHz band) has been considered. In order to mitigate a path loss of radio waves and to increase a transfer distance of the radio waves in the ultrahigh frequency band, beamforming, massive multiple input multiple output (MIMO), full dimension MIMO (FD-MIMO), array antennas, analog beamforming, and large scale antennas for the 5G communication system have been discussed. Further, for system network improvement in the 5G communication system, technology developments have been made for an evolved small cell, advanced small cell, cloud radio access network (RAN), ultra-dense network, device to device communication (D2D), wireless backhaul, moving network, cooperative communication, coordinated multi-points (CoMP), and reception interference cancellation. In addition, in the 5G system, hybrid frequency shift keying (FSK) and quadrature amplitude modulation (QAM) and sliding window superposition coding (SWSC), which correspond to advanced coding modulation (ACM) systems, and filter bank multicarrier (FBMC), non-orthogonal multiple access (NOMA), and sparse code multiple access (SCMA), which correspond to advanced connection technologies, have been developed.

On the other hand, the Internet, which is a human centered connectivity network where humans generate and consume information, is now evolving to the internet of things (IoT) where distributed entities, such as things, exchange and process information. The internet of everything (IoE), which is a combination of the IoT technology and big data processing technology through connection with a cloud server, has emerged. As technology elements, such as sensing technology, wired/wireless communication and network infrastructure, service interface technology, and security technology, have been demanded for IoT implementation, a sensor network for machine-to-machine connection, machine-to-machine (M2M) communication, machine type communication (MTC), and so forth have been recently researched. Such an IoT environment may provide intelligent internet technology (IT) services that create a new value by collecting and analyzing data generated among connected things. The IoT may be applied to a variety of fields including a smart home, a smart building, a smart city, a smart car or connected cars, a smart grid, health care, smart appliances, and advanced medical services through convergence and combination between the existing information technology (IT) and various industries.

Accordingly, various attempts have been made to apply the 5G communication system to IoT networks. For example, technologies of sensor network, M2M communication, and MTC have been implemented by techniques for beam-forming, multiple input multiple output (MIMO), and array antennas, which correspond to the 5G communication technology. As the big data processing technology as described above, application of a cloud RAN would be an example of convergence between the 5G technology and the IoT technology.

As communication technology required for next-generation IoT technology, IoT devices have characteristics that are quite different from that of the existing cellular communication system. In particular, in the existing cellular communication system, data rate and quality of service (QoS) determine communication quality, whereas in the IoT environment, lots of connectivity should be guaranteed, and a peak-to-average power ratio (PAPR) for reducing a drive power is important due to miniaturization of mobile devices and battery limitations. Further, in order to guarantee the coverage increase of the next-generation mobile communications and the performance of users at the edge of a cell, a power boost is may be necessary. However, due to nonlinearity of a power amplifier, the possible amount of power boost is closely related to the PAPR, and thus lowering of the PAPR is directly related to the increasing coverage performance.

Recently, with the development of LTE and LTE-Advanced, there is a need for a method and an apparatus for a low PAPR in a wireless communication system.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a method and an apparatus for effectively reducing a peak-to-average power ratio (PAPR) of a signal in a wireless communication system.

Another aspect of the disclosure provides a method and an apparatus for reducing a PAPR of a signal transmitted from a transmitting end of a wireless communication system.

Another aspect of the disclosure provides a method and an apparatus for selectively applying spectrum shaping and discrete Fourier transform (DFT) spreading at a transmitting end of a wireless communication system.

Another aspect of the disclosure provides a method and an apparatus for heightening a data rate while reducing a PAPR of a signal transmitted from a transmitting end of a wireless communication system.

Another aspect of the disclosure provides a method and an apparatus for heightening a reception rate of a signal transmitted with a low PAPR at a receiving end of a wireless communication system.

Additional aspects will be set forth in part in the description which follows and, in part, will be apparent from the description, or may be learned by practice of the presented embodiments.

In accordance with an aspect of the disclosure, an operation method by a transmitting end in a wireless communication system is provided. The method includes identifying a resource allocated to transmit data to a receiving end, applying a filter to the data, mapping the filtered data to one or more subcarriers, converting the mapped data into a time domain, and transmitting the data converted into the time domain, wherein the filter is determined based on the allocated resource and is shared by the transmitting end and the receiving end.

According to the method and the apparatus according to the various embodiments of the disclosure, the PAPR can be reduced by performing time domain cyclic filtering or filtering for giving a weight value for each frequency domain subcarrier. Further, the data rate or the coverage can be improved by selectively transmitting transmission waveforms through cyclic prefix-orthogonal frequency division multiplexing (CP-OFDM) or DFT-spread-orthogonal frequency division multiplexing (DFT-s-OFDM).

The effects obtained in the disclosure are not limited to the above-described effects, and other non-mentioned effects could be clearly understood by those of ordinary skill in the art to which the disclosure pertains.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Terms used in the disclosure are merely to explain a specific embodiment, and may not intend to limit the scope of other embodiments. A singular expression may include a plural expression unless it has a clearly different meaning from the context. The terms, used herein, including technical or scientific terms, may have the same meanings as those generally understood by those of ordinary skill in the art to which the disclosure pertains. Among the terms used in the disclosure, the terms defined in general dictionaries may be construed to have the same or similar meanings as or to the meanings from the context of the related technology, and unless clearly defined in the disclosure, the terms are not construed to have ideal or excessively formal meanings. According to circumstances, even the terms defined in the disclosure may not be construed to exclude embodiments of the disclosure.

Various embodiments of the disclosure described hereinafter will be described as an example of a method implemented by hardware devices. However, since various embodiments of the disclosure include technology using both hardware and software, they do not exclude a method implemented at least in part by software.

Hereinafter, the disclosure relates to an apparatus and a method for transmitting and receiving a signal in a wireless communication system. Specifically, various embodiments of the disclosure to reduce a peak-to-average power ratio (PAPR) in a wireless communication system will be described.

In the following description, terms referring to network entities (e.g., transmitting end and receiving end), terms referring to various signal processing devices (e.g., filters), and terms referring to integral devices of the apparatus (e.g., communication unit and controller) are exemplified for convenience in explanation. Accordingly, the disclosure is not limited to the terms to be described later, but other terms having equivalent technical meanings may be used.

Figure 1:
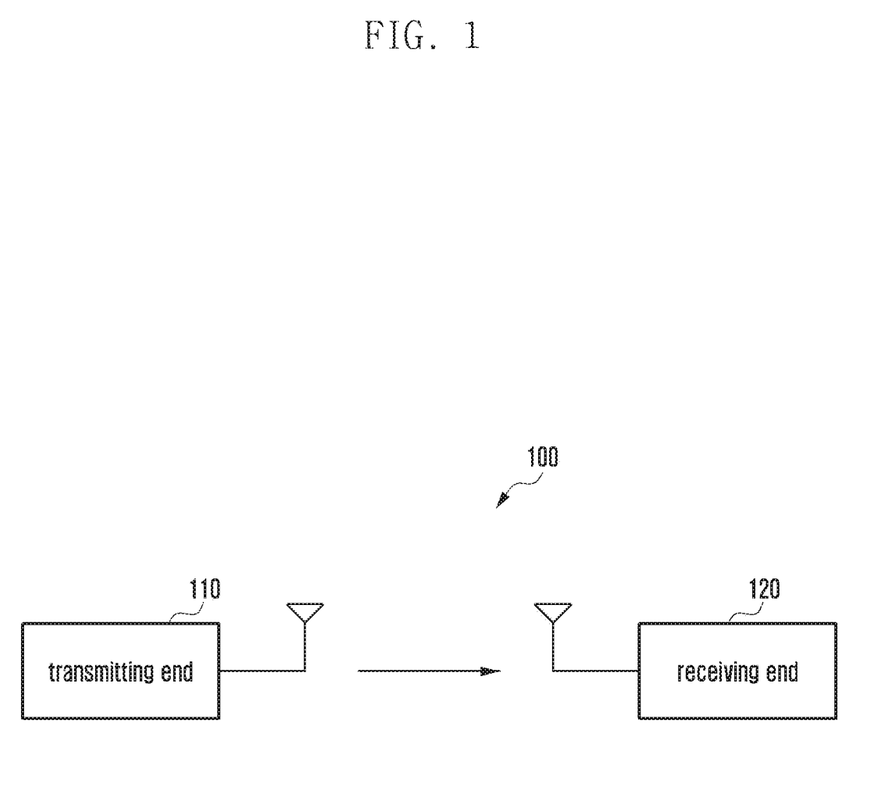
FIG. 1 is a diagram illustrating an example of a wireless communication system according to various embodiments of the disclosure.

FIG. 1 is a diagram illustrating a wireless communication system according to various embodiments of the disclosure.

Referring to FIG. 1, a transmitting end 110 and a receiving end 120 are illustrated as nodes using radio channels in a wireless communication system 100. Although FIG. 1 illustrates one transmitting end 110 and one receiving end 120, the system may include a plurality of transmitting ends and a plurality of receiving ends. Further, for convenience in explanation, although the transmitting end 110 and the receiving end 120 are explained as separate entities in the description, the functions of the transmitting end 110 and the receiving end 120 may be different complementary devices. For example, in an uplink (UL) of a cellular communication system, the transmitting end 110 may be a terminal, and the receiving end 120 may be a base station, whereas in a downlink (DL), the transmitting end 110 may be a base station, and the receiving end 120 may be a terminal. A PAPR reduction technique according to various embodiments of the disclosure may be applied to not only the uplink case but also the downlink case.

The transmitting end 110 and the receiving end 120 may transmit and receive radio signals in a millimeter wave (mmWave) band (e.g., 28 GHz, 30 GHz, 38 GHz, and 60 GHz). In this case, to improve channel gain, the transmitting end 110 and the receiving end 120 may perform beamforming. Here, the beamforming includes transmission beamforming and reception beamforming. That is, the transmitting end 110 and the receiving end may give directivity to a transmitted signal or a received signal. For this, the transmitting end 110 and the receiving end 120 may select at least one serving beam through a beam search procedure. According to various embodiments of the disclosure, a superior PAPR reduction performance may be required due to the high frequency characteristic of the millimeter waves.

Further, the wireless communication system according to various embodiments of the disclosure can provide a service requiring massive terminal connection, which is referred to as a massive machine type communication (mMTC) service. For example, the mMTC service may be used for the internet of things (IoT) technology. The mMTC service may require a wide coverage to provide the service with respect to massive terminals. According to various embodiments of the disclosure, the transmitting end 110 and the receiving end 120 are devices for the mMTC service, and PAPR performance may need to be improved due to device miniaturization and battery limits.

The PAPR is an important measure to determine the drive power of the mobile device. If the PAPR is high, severe distortion occurs through nonlinear elements (e.g., an analog-to-digital converter (ADC), a digital-to-analog converter (DAC), and a power amplifier), and thus high-performance elements having high linearity are required, which increases manufacturing costs. Further, if field effect transistor (FET)-series elements, such as complementary metal oxide semi-conductors (CMOS), are used as the high-performance elements satisfying the linearity, a sufficiently high power supply voltage is required to increase power consumption. Accordingly, if the PAPR of a transmitted signal is high, there is a possibility that a problem occurs in the uplink, and particularly, in an mMTC environment of the 5th generation (5G) communications in which a large number of low-power devices are expected to access the network, it is essential to lower the PAPR. In the 4th generation (4G) communications (e.g., long term evolution (LTE)), rather than the orthogonal frequency division multiplexing (OFDM) having a high PAPR, discrete Fourier transform (DFT)-spread-OFDM (DFT-s-OFDM), has been used to reduce the PAPR. In the next-generation mobile communications, a wider coverage is required, and technologies to improve the performance of users at the edge of a cell through power boost have been considered. However, the DFT-s-OFDM technique is not sufficient to boost the power based on the PAPR performance and the amplifier performance. In the related art, the PAPR is reduced through cutoff of signals exceeding the maximum value with acceptance of the distortion, or allocation of additional frequency resources have been proposed. However, in the disclosure, the PAPR can be lowered without additional frequency resources by modifying the DFT-s-OFDM. Further, the present disclosure is intended to minimize deterioration of the reception performance by changing the structure of a receiver.

According to various embodiments of the disclosure, transmission and reception of binary phase shift keying (BPSK) symbols having improper properties are exemplarily described. However, the scope of the disclosure is not limited to such transmission and reception of the BPSK symbols, but the disclosure can be applied to transmission and reception of symbols having improper properties or other types of symbols. If a pseudo covariance matrix of symbol vectors is a zero matrix (0), it is defined that the symbol vectors are proper. If the pseudo covariance matrix of symbol vectors is not a zero matrix, but is another matrix, then the symbol vectors are improper. The PAPR reduction technique according to various embodiments of the disclosure may apply a widely linear receiver using impropriety of the BPSK symbols.

Figure 2:
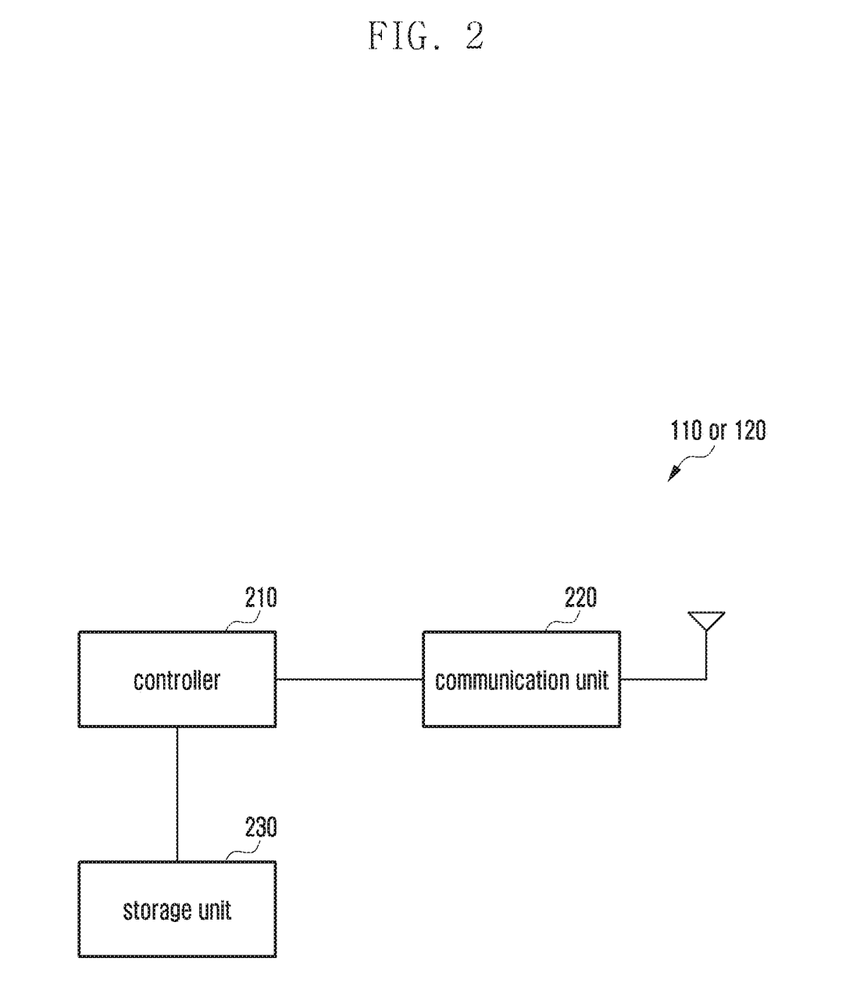
FIG. 2 is a diagram illustrating an example of a configuration of an apparatus in a wireless communication system according to various embodiments of the disclosure.

FIG. 2 is a diagram illustrating a configuration of an apparatus in a wireless communication system according to various embodiments of the disclosure.

Referring to FIG. 2, this example may be understood as the configuration of a transmitting end 110 or a receiving end 120. The term "~unit" or "~er", used hereinafter, means a unit for processing at least one function or operation, and may be implemented by hardware, software, or a combination of hardware and software.

Referring to FIG. 2, the apparatus may include a controller 210, a communication unit 220, and a storage unit 230.

The controller 210 may control the whole operations of the apparatus. For example, the controller 210 may transmit and receive a signal through the communication unit 220. Further, the controller 210 may write/read data in/from the storage unit 230. For this, the controller 210 may include at least one processor or microprocessor, or may be a part of a processor. Further, a part of the communication unit 220 and the controller 210 may be referred to as a communication processor (CP). In particular, according to various embodiments, the controller 210 controls the communication unit 220 to perform an operation for PAPR reduction by modulating or demodulating the signal. In other words, the controller 210 may control the operations of respective components included in the communication unit 220. For example, the controller 210 may control the transmitting end 110 or the receiving end 120 to perform the operations according to various embodiments.

The communication unit 220 may perform various functions to transmit/receive signals through radio channels. For example, the communication unit 220 may perform a conversion function between a baseband signal and a bit stream in accordance with the physical layer standard of the system. For example, during data transmission, the communication unit 220 may generate complex symbols by encoding and modulating the transmitted bit stream. Further, during data reception, the communication unit 220 may restore the received bit stream through demodulation and decoding of the baseband signal. Further, the communication unit 220 may perform up-conversion of the baseband signal into a radio frequency (RF) band signal to transmit the RF band signal through an antenna, and may perform down-conversion of the RF band signal received through the antenna into a baseband signal.

For this, the communication unit 220 may include a transmission filter, a reception filter, an amplifier, a mixer, an oscillator, a DAC, and an ADC. Further, the communication unit 220 may include a plurality of transmission/reception paths. Further, the communication unit 220 may include at least one antenna array composed of a plurality of antenna elements. From the hardware side, the communication unit 220 may be composed of a digital unit and an analog unit, and the analog unit may be composed of a plurality of sub-units in accordance with an operating power and an operating frequency.

As described above, the communication unit 220 transmits and receives signals. Accordingly, the communication unit 220 may be referred to as a transmission unit, a reception unit, or a transceiver. Further, in the following description, the transmission and reception performed through the radio channels are used to include the above-described processes performed by the communication unit 220. Further, the communication unit 220 may include a backhaul communication unit for communications with other network entities connected through a backhaul network.

The storage unit 230 may store basic programs for operating the apparatus, application programs, and data, such as configuration information. The storage unit 230 may be composed of a volatile memory, a nonvolatile memory, or a combination of the volatile memory and the nonvolatile memory. Further, the storage unit 230 may provide the stored data in accordance with a request from the controller 210.

Figure 3:
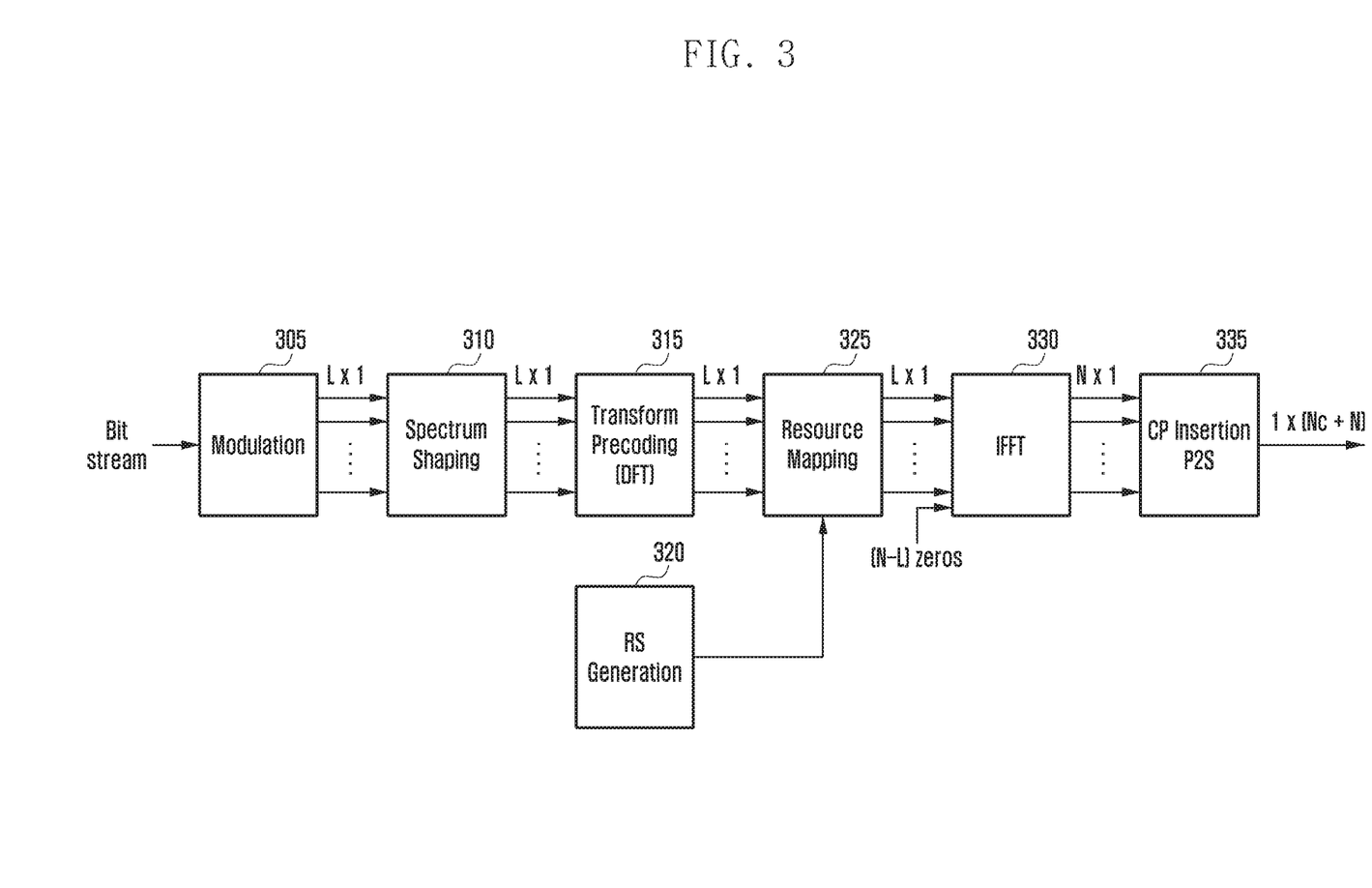
FIG. 3 is a diagram illustrating an example of a configuration of a communication unit of a transmitting end in a wireless communication system according to various embodiments of the disclosure.

FIG. 3 is a diagram illustrating an example of a configuration of a communication unit of a transmitting end in a wireless communication system according to various embodiments of the disclosure.

Referring to FIG. 3, the illustrated configuration may be understood as a partial configuration of the communication unit 220 of the transmitting end 110. The communication unit illustrated in FIG. 3 may include a modulation block 305, a spectrum shaping block 310, a DFT block 315, a reference signal (RS) generation block 320, a resource mapping block 325, an inverse fast Fourier transform (IFFT) block 330, and a cyclic prefix (CP) insertion block 335.

The modulation block 305 may receive an input of a bit stream encoded through an error correction encoder and a scrambler, such as a low density parity code (LDPC) and a Polar code, and may generate complex symbols corresponding to a given modulation type. According to various embodiments of the disclosure, the complex symbols may be data symbols modulated by π/2-BPSK, π/4-quadrature phase shift key (QPSK), BPSK, QPSK, 16-quadrature amplitude modulation (QAM), 64-QAM, and 256-QAM. In particular, the π/2-BPSK or π/4-QPSK modulation type may reduce reinforcement probability of the signal due to an in-phase on time, and may further reduce the PAPR of the signal to be transmitted as compared with the BPSK or QPSK modulation type.

As an example, Table 1 shows an output complex symbol mapping rule corresponding to input bits if the modulation block 305 uses the π/2-BPSK modulation. The complex-valued modulation symbol of the modulation block with respect to a single bit b(2i) or b(2i+1) is x=I+jQ. That is, if it is assumed that the symbol power is normalized as an average, it means that constellation of the corresponding bit is changed to $$e^{j\frac{\pi}{4}}, e^{j\frac{5\pi}{4}}, e^{j\frac{3\pi}{4}} \text{ or } e^{j\frac{7\pi}{4}}$$

in accordance with evenness/oddness of indexes of the input bit stream. In addition, in the disclosure, it is sufficient that the output symbol mapping rule with respect to the input bit 0/1 is in a one-to-one correspondence, and is not limited to the correspondence of Table 1. That is, in Table 1, the one-to-one correspondence may be changed to map 1 and 0 to $$e^{j\frac{\pi}{4}}, e^{j\frac{5\pi}{4}}$$

respectively. Further, even in case of the constellation, an initial phase value is not limited to 45° as in Table 1. However, it is sufficient that a phase difference between the respective constellations is 180° when the indexes of the input bits are changed to oddness/evenness. As an example, instead of the constellation using $$e^{j\frac{\pi}{4}}, e^{j\frac{5\pi}{4}} \text{ or } e^{j\frac{3\pi}{4}}, e^{j\frac{7\pi}{4}}$$

as in Table 1, $$e^{j0}, e^{j\pi} \text{ or } e^{j\frac{\pi}{2}}, e^{j\frac{3\pi}{2}}$$

may be used as the constellation.

TABLE 1

| π/2-BPSK modulation mapping | | | | | |
|---|---|---|---|---|---|
| b(2i) | I | Q | b(2i + 1) | I | Q |
| 0 | 1/√2 | 1/√2 | 0 | −1/√2 | 1/√2 |
| 1 | −1/√2 | −1/√2 | 1 | 1/√2 | −1/√2 |

As another example, Table 2 shows an output complex symbol mapping rule corresponding to input bits if the modulation block 305 uses the π/4-BPSK modulation. The complex-valued modulation symbol of the modulation block with respect to a single bit b(4i), b(4i+1), b(4i+2), or b(4i+3) is x=I+jQ. That is, if it is assumed that the symbol power is normalized as an average, it means that constellations of 2-bit pairs of the input bit stream are alternately used as $$e^{j\frac{\pi}{4}}, e^{j\frac{3\pi}{4}}, e^{j\frac{5\pi}{4}}, e^{j\frac{7\pi}{4}} \text{ or } e^{j0}, e^{j\frac{\pi}{2}}, e^{j\pi}, e^{j\frac{3\pi}{2}}$$

in accordance with the order of the bit pairs. In addition, in the disclosure, it is sufficient that the output symbol mapping rule with respect to the input bit pairs 00/01/10/11 is in a one-to-one correspondence as in the case of π/2-BPSK, and is not limited to the correspondence of Table 2. Further, even in case of the constellation, an initial phase value is not limited to 45° as in Table 2. However, it is sufficient that a phase difference between the respective constellations of the successively input bit pairs is 90°. As an example, of the constellations using $$e^{j\frac{\pi}{4}}, e^{j\frac{3\pi}{4}}, e^{j\frac{5\pi}{4}}, e^{j\frac{7\pi}{4}} \text{ or } e^{j0}, e^{j\frac{\pi}{2}}, e^{j\pi}, e^{j\frac{3\pi}{2}}$$

as in Table 2, the latter (initial phase value of 0°) may be used as the initial constellation.

TABLE 2

π/4-QPSK modulation mapping

| b(4i), b(4i + 1) | I | Q | b(4i + 2), b(4i + 3) | I | Q |
| --- | --- | --- | --- | --- | --- |
| 00 | $1/\sqrt{2}$ | $1/\sqrt{2}$ | 00 | 1 | 0 |
| 01 | $1/\sqrt{2}$ | $-1/\sqrt{2}$ | 01 | 0 | -1 |
| 10 | $-1/\sqrt{2}$ | $1/\sqrt{2}$ | 10 | 0 | 1 |
| 11 | $-1/\sqrt{2}$ | $-1/\sqrt{2}$ | 11 | -1 | 0 |

The spectrum shaping block 310 may perform time-domain spectrum shaping with respect to data symbols provided from the modulation block 305. Referring to FIG. 3, the spectrum shaping block 310 may receive an input of L complex data symbols from the modulation block 305, performs circular convolution of the L complex data symbols with given spectrum shaping filter coefficients, and output the L processed complex data symbols to the DFT block 315. In other words, when applying the spectrum shaping to reduce the PAPR, additional frequency resources are not used, but L pieces of filtered data corresponding to L input data symbols are output and transferred to the DFT block 315.

The DFT block 315 can convert the data symbols into frequency-domain data by performing DFT with respect to the data symbols provided from the spectrum shaping block 310. Referring to FIG. 3, the DFT block 315 may receive the L complex symbols from the spectrum shaping block 310, and convert the L complex symbols into L frequency-domain symbols to be output to the resource mapping block 325.

The RS generation block 320 may generate a signal pre-engaged between the transmitting end and the receiving end so that the receiving end can use the signal when performing channel estimation to smoothly demodulate the data. That is, the signal generated by the RS generation block 320 may be a demodulation reference signal (DMRS), and a corresponding signal generation method may be expressed as a function related to the frame structure of the system, the size of an allocated time/frequency resource, DFT length, a cell identifier (ID), and user ID. According to various embodiments of the disclosure, the RS generation block 320 may generate a DMRS having the size of the frequency resource allocated by the base station, that is, DFT length of L, and output the generated DMRS to the resource mapping block 325.

The resource mapping block 325 may map the symbols provided from the DFT block 315 and the RS generation block 320 to OFDM subcarrier and symbol locations engaged between the transmitting end and the receiving end, and output the symbols to a corresponding IFFT input location. According to various embodiments of the disclosure, the L data symbols input from the DFT block 315 and the L DMRS input from the RS generation block 320 may maintain the single carrier property of data, and may be time-division-multiplexed and mapped to the OFDM symbols to obtain low PAPR. For example, if the first and second OFDM symbols are configured on a physical uplink control channel (PUCCH), the third OFDM symbol is configured as a DMRS, and the remaining 11 symbols are configured on a physical uplink shared channel (PUSCH) in a state where a slot composed of 14 OFDM symbols exists as a resource allocation unit, L DMRSs input from the RS generation block 320 are output to the IFFT block 330 when the third OFDM symbol is generated, and the L data symbols input from the DFT block 315 are output to the IFFT block 330 when one of the remaining 11 symbols is generated.

The IFFT block 330 may convert a signal provided from the resource mapping block 325 into a time domain. Referring to FIG. 3, the IFFT block 330 may convert the symbols provided from the resource mapping block 325 into N time-domain symbols by applying the IFFT having a size of N with respect to the symbols provided from the resource mapping block 325. In this case, the IFFT is performed in a manner that the L symbols provided from the resource mapping block 325 are mapped to L subcarrier indexes corresponding to the frequency domain pre-engaged between the transmitting end and the receiving end among N input subcarrier indexes to be input, and 0 is input as the remaining (N-L) subcarrier index inputs. The time-domain data converted by the IFFT block 330 may be provided to the CP insertion block 335.

The CP insertion block 335 may insert the CP into the time-domain data. Referring to FIG. 3, the CP insertion block 335 may perform parallel-to-serial (P2S) conversion of (Nc+N) symbols to be output by adding/copying symbols corresponding to (N−Nc+1) to N indexes among N symbols converted into the time domain by the IFFT block 330 into the front of an index 1 symbol. The symbols output from the CP insertion block 335 may be up-converted through the DAC and RF modules to be transmitted to the receiving end 120 through the antenna.

According to various embodiments of the disclosure, one of finite filters pre-engaged between the transmitting end and the receiving end may be used as the spectrum shaping filter coefficient, a filter coefficient in a one-to-one correspondence in accordance with the DFT length may be used, or one unique filter coefficient may be used regardless of the DFT length.

According to various embodiments of the disclosure, the spectrum shaping block 310 may be applied to be limited to a specific modulation level and a transmission waveform type. For example, during uplink transmission of the cellular system, the base station may select and transmit one waveform of cyclic-prefix OFDM (CP-OFDM) and DFT-s-OFDM to the terminal, and the spectrum shaping may be applied only during transmission of the π/2-BPSK DFT-s-OFDM.

Further, considering that the spectrum shaping is a capability of the terminal, the terminal notifies the base station whether the spectrum shaping is possible during a capability negotiation process in which the terminal transfers its capability to the base station during an initial access, and the base station can determine whether to apply the spectrum shaping when the base station transmits uplink data to the corresponding terminal through a combination of a specific waveform and a modulation type. As an example, when a terminal includes the spectrum shaping capability, the base station may indicate whether to apply the spectrum shaping to the corresponding terminal through a downlink channel information (DCI) or radio resource control (RRC) during transmission of physical uplink shared channel (PUSCH) to the π/2-BPSK DFT-s-OFDM.

In addition, the spectrum shaping may be associated with a power class of the terminal to achieve the capability negotiation. As an example, the terminal may transfer capability information to the base station by determining whether to apply the spectrum shaping based on the power class of the terminal. For example, if the corresponding power class information of the terminal is acquired through mapping of "spectrum shaping impossible" to a 23 dBm terminal and mapping of "spectrum shaping possible" to a 26 dBm terminal, the base station may determine whether to apply the spectrum shaping of the corresponding terminal. In this case, with respect to the terminal in which the spectrum shaping is possible, the base station may always apply the spectrum shaping (pre-engaged between the base station and the terminal) during transmission of the uplink data through a combination of the specific waveform and the modulation type, and it may determine whether to apply the spectrum shaping through signaling as described above.

Now, a method by a terminal for generating an uplink transmission signal according to the disclosure during transmission of the PUSCH of the system will be described in detail.

Figure 4:
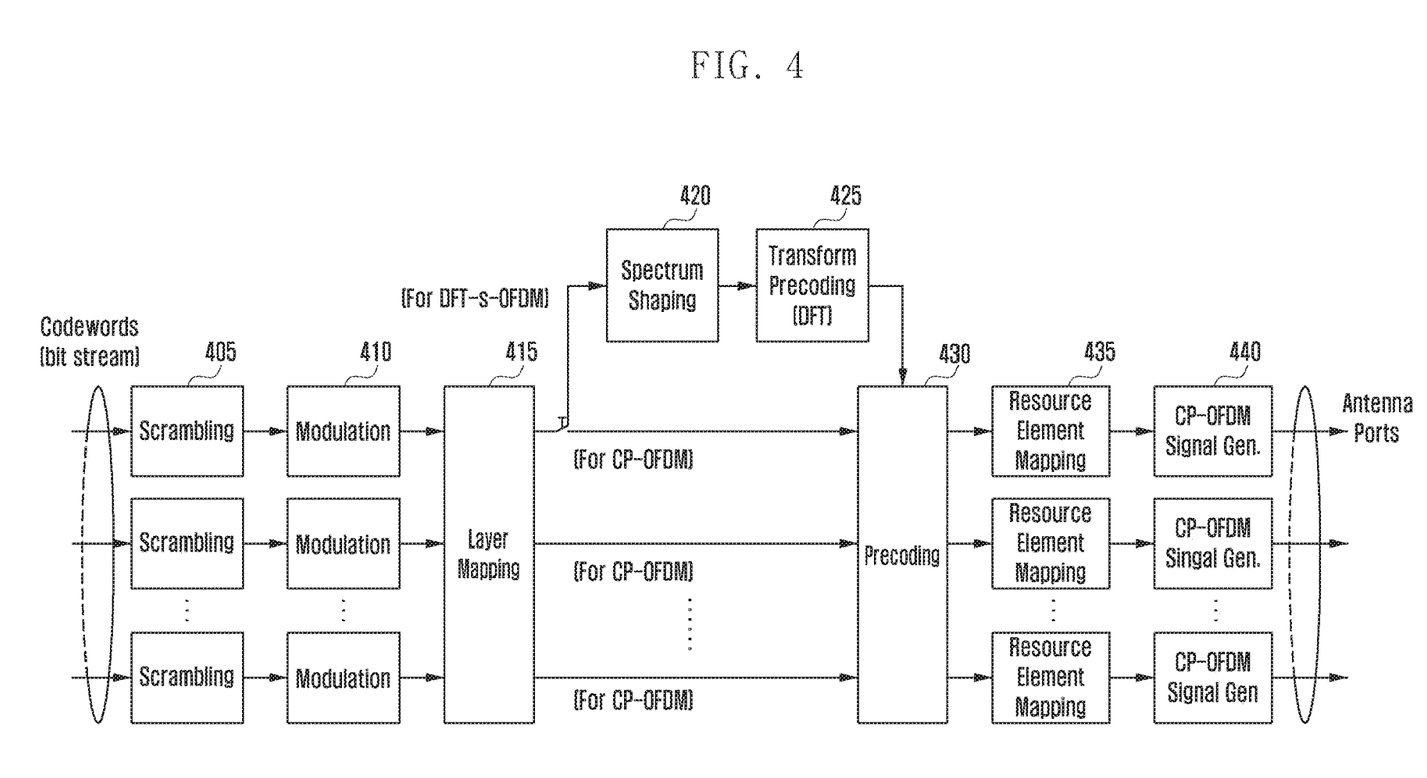
FIG. 4 is a diagram illustrating an example of a configuration of a communication unit of a terminal transmitting end in a cellular system according to various embodiments of the disclosure.

FIG. 4 is a diagram illustrating an example of a configuration of a communication unit of a terminal transmitting end in a wireless communication system according to various embodiments of the disclosure.

Referring to FIG. 4, the illustrated configuration may be understood as a partial configuration of a communication unit 220. In one example, the example illustrated in FIG. 4 is block diagram of a PUSCH transmission structure of a terminal in a cellular system. The communication unit 220 illustrated in FIG. 4 may include a scrambling block 405, a modulation block 410, a layer mapping block 415, a spectrum shaping block 420, a DFT (or transform precoder) block 425, a precoding block 430, a resource element mapping (or resource element mapper) block 435, and a CP-OFDM signal generation block 440.

The terminal may generate one or more code words through error correction coding of data bits to be transmitted in a rule pre-engaged with the base station. With respect to each code word q, the scrambling block 405 of FIG. 4 may perform scrambling in the rule pre-engaged with the base station. If it is assumed that an output bit stream of the scrambling block 405 is $\tilde{b}^{(q)}(0), \ldots, \tilde{b}^{(q)}(M_{bit}^{(q)}-1)$, the modulation block 410 of FIG. 4 may receive the bit stream $\tilde{b}^{(q)}(0), \ldots, \tilde{b}^{(q)}(M_{bit}^{(q)}-1)$, perform modulation in accordance with the modulation type indicated by the base station, and then output modulated complex-valued symbols $d^{(q)}(0), \ldots, d^{(q)}(M_{symb}^{(q)}-1)$. The modulated complex-valued symbols $d^{(q)}(0), \ldots, d^{(q)}(M_{symb}^{(q)}-1)$ may be mapped to layer symbol vectors having one or more entries $x(i)=[x^{(0)}(i) \ldots x^{(v-1)}(i)]^T, i=0, 1, \ldots, M_{symb}^{layer}-1$. Here, v means the number of layers, and $M_{symb}^{layer}$ means the number of modulated symbols per layer.

In the 5G cellular system, the CP-OFDM or DFT-s-OFDM may be used as the uplink waveform, and the multiple input multiple output (MIMO)-transmittable CP-OFDM may be used to improve the data rate, whereas the DFT-s-OFDM may be used as a single layer (SISO) transmission to improve the coverage. In other words, in accordance with the selection of the base station, the terminal may apply or bypass the spectrum shaping block 420 and the DFT block 425.

Further, in accordance with the selection of the base station, the terminal may bypass the spectrum shaping block 420, and may apply the DFT block 425. This is to make it possible to selectively transmit the spectrum shaping in accordance with the implementation of the base station.

In particular, the DFT-s-OFDM may be transmitted through a single layer, that is, layer 0, and in this case, the role of the layer mapping block is to pass an input symbol over to an output symbol as it is without any processing. This is expressed by a mathematical expression $x^{(0)}(t)=d^{(0)}(t)$, a relationship $M_{symb}^{layer}=M_{symb}^{(0)}$ is established, and an input of the spectrum shaping block 420) becomes $x^{(0)}(0), \ldots, x^{(0)}(M_{symb}^{layer}-1)$ During the PUSCH transmission, the terminal can extract the DFT size $M_{sc}^{PUSCH}$ through PUSCH resource allocation information transferred from the base station through the physical downlink control channel (PDCCH). This value may be expressed by a mathematical expression $M_{sc}^{PUSCH}=M_{RB}^{PUSCH} \cdot N_{sc}^{RB}$, where $M_{RB}^{PUSCH}$ is a PUSCH bandwidth expressed by the number of resource blocks (RBs) that is a unit of resource allocation, and $N_{sc}^{RB}$ is the number of OFDM subcarriers constituting one resource block. Specifically, in the 5G cellular system, $N_{sc}^{RB}=12$, and $M_{RB}^{PUSCH}$ may be limited to finite natural number values that satisfy mathematical expression 1 to reduce the DFT implementation complexity of the terminal.

$$M_{RB}^{PUSCH}=2^{\alpha_2} \cdot 3^{\alpha_3} \cdot 5^{\alpha_5} \leq N_{RB}^{UL} \quad \text{Mathematical expression 1}$$

where $\alpha_2, \alpha_3, \alpha_5$ is a set of non-negative integers, and $N_{RB}^{UL}$ is the maximum number of subcarriers allocated for PUSCH in the system.

The terminal may receive an indication of DFT-s-OFDM application and spectrum shaping application from the base station during the PUSCH transmission through the PDCCH or RRC message. In particular, the spectrum shaping application may be applied in association with a specific modulation type. As an example, the terminal may limitedly apply the spectrum shaping only during π/2-BPSK DFT-s-OFDM transmission or π/4-QPSK DFT-s-OFDM transmission.

Hereinafter, detailed operations of the spectrum shaping block 420 and the DFT block 425 will be described in case where the terminal applies the spectrum shaping and the DFT spreading during the PUSCH transmission.

In FIG. 4, the spectrum shaping block 420 performs the spectrum shaping after the DFT block 425, that is, in time domain. This operation mathematically means circular convolution between the input symbol vectors having the DFT block length and the spectrum shaping filters.

The spectrum shaping filter may be applied using a coefficient engaged between the base station and the terminal. In this case, if the spectrum shaping filter coefficient is defined in frequency domain, that is, if the spectrum shaping filter coefficient is defined as a multiplication operation coefficient for each symbol after the DFT spreading, the coefficient should be defined in accordance with the DFT size and type, and it is difficult to express the same in standard. To solve this, one frequency domain spectrum shaping function is defined in real number region [0, 2π) or [−π, π), and the corresponding region is uniformly sampled and then is normalized to be used. In this case, mathematically the same operation can be simply defined and performed before the DFT spreading, that is, through the time-domain spectrum shaping filter.

Mathematical expression 2 is an example of the time-domain spectrum shaping filter $h_{ss}[i]$ according to the disclosure.

$$h_{ss}[i] = \frac{1}{\sqrt{2}} \delta[i] - \frac{1}{\sqrt{2}} \delta[i-1]$$ Mathematical expression 2 where δ[i] is the delta function in discrete-time domain defined as follows:

$$\delta[i] = \begin{cases} 1, \text{ for } i = 0 \\ 0, \text{ for integer } i \neq 0 \end{cases}$$

Mathematical expression 3 is another example of definition of the time-domain spectrum shaping filter $h_{ss}[i]$ according to the disclosure.

Mathematical expression 3

$$h_{ss}[i] = \frac{1}{\sqrt{2}} \delta[i] - \frac{1}{\sqrt{2}} e^{-j\frac{\pi}{M_{sc}^{PUSCH}}} \delta[i-1]$$

where δ[i] is the delta function in discrete-time domain defined as follows:

$$\delta[i] = \begin{cases} 1, \text{ for } i = 0 \\ 0, \text{ for integer } i \neq 0 \end{cases}$$

The spectrum shaping block 420 separates an input $x^{(0)}(0), \ldots, x^{(0)}(M_{symb}^{layer}-1)$ as many as the number of $M_{symb}^{layer}/M_{sc}^{PUSCH}$, and outputs $x'^{(0)}(0), \ldots, x'^{(0)}(M_{symb}^{layer}-1)$ by performing a circular convolution operation with the spectrum shaping filter $h_{SS}[i]$ with respect to $M_{sc}^{PUSCH}$-numbered symbols. This may be expressed by mathematical expression 4.

Mathematical expression 4

$$x'^{(0)}(l \cdot M_{sc}^{PUSCH} + i) = \sum_{k=0}^{L_k-1} h_{ss}[k] \cdot x^{(0)}(l \cdot M_{sc}^{PUSCH} + (i-k)_{M_{sc}^{PUSCH}})$$

$$i = 0, \ldots, M_{sc}^{PUSCH} - 1$$

$$l = 0, \ldots, M_{symb}^{layer}/M_{sc}^{PUSCH} - 1$$

where $L_h$ is number of filter taps of $h_{SS}[i]$ ($L_h \leq M_{sc}^{PUSCH}$) and $(i-k)_{M_{sc}^{PUSCH}}$ is modulo operation with $M_{sc}^{PUSCH}$. For example, $(-1)_{M_{sc}^{PUSCH}} = M_{sc}^{PUSCH} - 1$.

The DFT block 425 respectively performs DFT with respect to $M_{symb}^{layer}/M_{sc}^{PUSCH}$-numbered blocks composed of $M_{sc}^{PUSCH}$-numbered complex symbols to output the transformed blocks. This may be expressed by mathematical expression 5.

Mathematical expression 5

$$y^{(0)}(l \cdot M_{sc}^{PUSCH} + k) = \frac{1}{\sqrt{M_{sc}^{PUSCH}}} \sum_{i=0}^{M_{sc}^{PUSCH}-1} x'^{(0)}(l \cdot M_{sc}^{PUSCH} + i) e^{-j\frac{2\pi i k}{M_{sc}^{PUSCH}}}$$

-continued $$k = 0, \ldots, M_{sc}^{PUSCH} - 1$$

$$l = 0, \ldots, M_{symb}^{layer}/M_{sc}^{PUSCH} - 1$$

The precoding block 430 applies spatial precoding with respect to each layer symbol when the terminal performs SISO or MIMO transmission with CP-OFDM OFDM waveforms $z^{(0)}(i) = y^{(0)}(i)$, where $i=0, 1, \ldots, M_{symb}^{ap}-1$, $M_{symb}^{ap} = M_{symb}^{layer}$ in an uplink. In this case, different precoders may be applied in accordance with the transmission mode. If it is assumed that an output of the layer mapping block 415 is $[y^{(0)}(i) \ldots y^{(v-1)}(i)]^T$, $i=0, 1, \ldots, M_{symb}^{layer}-1$, the precoding block 430 receives this, applies precoding thereof, and then outputs $[z^{(0)}(i) \ldots z^{(P-1)}(i)]^T$, $i=0, 1, \ldots, M_{symb}^{ap}-1$, to the resource mapping block element 435 for each antenna port. In this case, an output corresponding to layer 0 bypasses the spectrum shaping block 420 and the DFT block 425, and is directly sent as an input of the precoding block 430. General mathematical expression for the precoding corresponding to the CP-OFDM $z^{(0)}(i) = y^{(0)}(i)$, where $i=0, 1, \ldots, M_{symb}^{ap}-1$, $M_{symb}^{ap} = M_{symb}^{layer}$ may be expressed by mathematical expression 6.

Mathematical expression 6

$$z^{(0)}(i) = y^{(0)}(i), \text{ where } i = 0, 1, \ldots, M_{symb}^{ap} - 1, M_{symb}^{ap} = M_{symb}^{layer}$$

$$\begin{bmatrix} z^{(0)}(i) \\ \vdots \\ z^{(P-1)}(i) \end{bmatrix} = W \begin{bmatrix} y^{(0)}(i) \\ \vdots \\ y^{(v-1)}(i) \end{bmatrix}, \text{ where } i = 0, 1, \ldots, M_{symb}^{ap} - 1, M_{symb}^{ap} = M_{symb}^{layer}$$

When the terminal performs single layer transmission with DFT-s-OFDM waveforms in an uplink, the output of layer 0 may be sent as the input of the precoding block 430 through the spectrum shaping block 420 and the DFT block 425. In this case, the role of the precoding block 430 is to bypass the corresponding signal, and this may be expressed by mathematical expression 7.

$$z^{(0)}(i) = y^{(0)}(i), \text{ where } i=0,1, \ldots, M_{symb}^{ap}-1,$$
$$M_{symb}^{ap} = M_{symb}^{layer}$$  Mathematical expression 7

Although not illustrated in FIG. 4, the resource element mapping block 435 and the CP-OFDM signal generation block 440 may insert the demodulation RS (DMRS) for channel estimation in a time division multiplexing (TDM) or frequency division multiplexing (FDM) form together with the PUSCH data symbols to generate the final CP-OFDM symbols.

During transmission of a single stream with the DFT-s-OFDM waveform, the baseband signal may be generally expressed by mathematical expression 8.

Mathematical expression 8

$$s_l^{(p)}(t) = \sum_{k=-\lfloor N_{RB}^{UL} N_{sc}^{RB}/2 \rfloor}^{\lceil N_{RB}^{UL} N_{sc}^{RB}/2 \rceil - 1} a_{k^{(-)},l}^{(p)} \cdot e^{j2\pi k \Delta f(t - N_{CP,l} T_s)}, \text{ for}$$

$$0 \leq t < (N_{CP,l} + N) \times T_s$$

Here, $K^{(-)}$ is a subcarrier index corresponding to a frequency resource that the base station has allocated to the terminal, and the corresponding index may differ in accordance with the resource mapping rule, Δf is an OFDM subcarrier spacing, NCP, 1 is the number of integer samples obtained by dividing the CP length of the first OFDM symbol by reference time Ts, and $a_{k,l}^{(p)}$ is a transmitted symbol to be mapped to the (k,l)-th resource element of antenna port p (k is a frequency-axis subcarrier index, and l means an OFDM symbol index).

The spectrum shaping coefficients in mathematical expression 4 may be determined in consideration of the PAPR of an uplink transmitted signal, performance of error vector magnitude (EVM)/block error rate (BLER) of the receiving end, implementation complexity, and the like. From the viewpoint of implementation complexity reduction, the above-described coefficients may be unified into one coefficient as expressed in mathematical expression 2 or 3, but the degree of freedom of terminal implementation may be heightened by specifying a specific condition. As an example, in case of the time-domain spectrum shaping (TDSS) as in mathematical expression 4, the following conditions may be specified instead of specifying the fixed coefficient.

Power normalization:

$$\sum_{i=0}^{L_h-1} |h_{ss}[i]^2| = 1$$

Maximum number of filter taps: For example, Lh≤3 or Lh=2

Characteristics of filter coefficient: For example, real-symmetric, conjugate-symmetric, equal-gain, low-pass, high-pass, and the like Dependency on DFT size: For example, whether the coefficient is function of L The above-described conditions may be simultaneously limited in all, or only partial conditions may be selectively adopted and limited. As an example, among the above-described conditions, the filter coefficient in mathematical expression 2 satisfies power normalization, the maximum number (2) of filter taps, equal-gain, high-pass, and dependence condition for the DFT size. Here, in addition, even if the terminal uses an unspecific coefficient, the filter coefficient should be selected so that the base station can satisfy the EVM requirements during reception.

Among the above-described conditions, the maximum number of filter taps is in close connection with filter delay and implementation complexity. Since the time-domain spectrum shaping is performed through the circular convolution operation, the complexity is increased in quadratic/cubic polynomial form as the number of non-zero taps is increased, and thus, if possible, the small number of non-zero taps facilitates lowering of the complexity. Further, if the non-zero tap does not exist from hss[0], but exists thereafter, the data symbol order before DFT during transmission and the data symbol order after an inverse DFT (IDFT) during reception and demodulation become different from each other to cause great performance deterioration due to a delay caused by the characteristics of the filter. Accordingly, to prevent this, the filter coefficient may be specified so that the base station and the terminal are aware of this, or the condition may be specified without specifying the filter coefficient to prevent a circular shift phenomenon due to the filter delay of the data symbol.

Among the above-described conditions, the reason for the low-pass/high-pass discrimination is that the resource element mapping block 435 can successively map the DFT outputs to the IFFT without generating an additional rule through definition of the high-pass filter by the TDSS coefficient when the uplink OFDM signal generation type is defined regardless of the waveform type, such as the CP-OFDM or DFT-s-OFDM as illustrated in mathematical expression 8. In case of also defining the low-pass filter, energy can be concentrated on the center of a band to which a transmission spectrum is allocated by mapping the DFT output to the IFFT through the circular shift by as much as a half of the DFT size.

Among the above-described conditions, the weight symmetry condition for the coefficient can constantly maintain a group delay of the filter regardless of the frequency (i.e., linear phase filtering becomes possible), and thus various low-complexity structures can be considered from the viewpoint of implementation.

The filter coefficients in mathematical expressions 2 and 3 have a difference in dependence on the DFT size. In implementation, the mathematical expression 2 is more simplified, whereas in energy symmetry of the transmission spectrum, the mathematical expression 3 is better to facilitate the adjacent channel leakage power ratio (ACLR) condition satisfaction. As for the frequency response in the mathematical expression 2, H[0] value is always 0, and gains of the remainders H[1] to H[L−1] are in a symmetric shape based on H[L/2]. Accordingly, there is no energy symmetry based on the entire DFT size, and the shape is somewhat inclined toward the right side (i.e., high frequency side). The filter coefficient in the mathematical expression 3 serves to correct this.

On the other hand, instead of the condition of the time-domain spectrum shaping filter, the condition of a frequency-domain spectrum shaping (FDSS) filter (may be called a window in view of the operation type) may give the degree of freedom of implementation to the terminal. FDSS coefficient extraction may vary in accordance with the DFT size, and in order to generate the coefficient in real time in accordance with the DFT size, the FDSS coefficient may be extracted by sampling to match the band allocated as much as the DFT size through selection of one of existing well-known window functions. A window function, such as root raised cosine, may be a representative, and since an excess bandwidth corresponding to a roll-off exists, a truncated RRC window in which all coefficients of a roll-off region are made 0 may be considered in order to use the band as much as the DFT size only without band extension. In this case, if a region in which FDSS coefficients on the center portion side of the transmission band have the same weight is called a "spectrum flatness" region, and a region of FDSS coefficients on the edge portion side of the transmission band, that is, affected by the roll-off, is called a "spectrum non-flatness" region, the spectrum flatness can be maintained based on the FDSS coefficient condition by limiting the number of tones to be multiplied by the non-flatness coefficient within a constant value, and thus a base station receiver can reduce the influence of the spectrum shaping coefficient even in a state where the base station receiver does not know the accurate spectrum shaping coefficient. However, this method may lower the PAPR reduction capability of the transmitted signal due to the spectrum shaping. Accordingly, if it is intended to limit the FDSS coefficient condition through the number of tones of the "spectrum non-flatness" region, the corresponding number of tones may be determined as a fixed value without depending on the allocated DFT size, or may be determined as a value depending on the allocated DFT size in consideration of the roll-off value. As an example, if the number of subcarriers in a physical resource block (PRB), which is a resource allocation unit, is 12, the number of FDSS non-flatness tones may be limited to 2 or 4 or less based on the minimum resource allocation unit, or may be limited to the number of tones corresponding to the RRC roll-off value β (0≤β≤1), that is, $\lfloor \beta \cdot M_{sc}^{PUSCH} \rfloor$ or less, for various DFT sizes $M_{sc}^{PUSCH}$ as mentioned in the mathematical expression 1. If it is intended to increase the spectrum flatness region, β value close to 0 is configured, and $\lfloor \cdot \rfloor$ is a floor function (a maximum integer that does not exceed a predetermined value).

A transmission method of a terminal will be described, which can maintain the reception performance without great deterioration even when the base station does not know the spectrum shaping coefficient used by the terminal in case where the terminal performs uplink transmission using the spectrum coefficient in the limited condition without using the spectrum shaping coefficient engaged between the base station and the terminal as described above.

The transmission structure as illustrated in FIGS. 3 and 4 transmits DMRS symbols for the PUSCH without applying the spectrum shaping when the terminal transmits data using the spectrum shaping coefficient pre-engaged between the base station and the terminal, and the base station estimates and equalizes the channel through the corresponding DMRS symbols, and then demodulates the data symbols of the terminal through proper post-processing (e.g., matched filtering) for the pre-engaged spectrum shaping after channel estimation and equalization through the corresponding DMRS symbols. However, if this method is used when the base station does not know the spectrum shaping coefficient used by the terminal, the performance may deteriorate due to an effective channel change caused by the spectrum shaping. Accordingly, if the terminal transmits the DMRS symbols through application of the spectrum shaping even to the DMRS symbols, the base station performs channel estimation and equalization based on the spectrum shaping as an effective channel coupled to an actual channel, and can obtain a great help in demodulating the data symbols.

In case of the PUSCH transmission through the DFT-s-OFDM, in the same manner as the existing LTE, the DMRS can use a sequence and a pattern designed regardless of the modulation type. As an example, if it is assumed that π/2-BPSK, QPSK, 16-QAM, 64-QAM, and 256-QAM exist as usable modulation types during the PUSCH transmission through the DFT-s-OFDM, the spectrum shaping is selectively applied only during the modulation through the π/2-BPSK, and thus the spectrum shaping can be applied to the DMRS only in this case. However, since the DMRS is normally designed as the frequency domain without applying the transform precoding (DFT) and is directly mapped to the IFFT, it is not possible to directly apply the circular convolution filter defined in the time domain. In this case, the DMRS to be used during the π/2-BPSK DFT-s-OFDM transmission to which the spectrum shaping is applied can be generated in two types (or apparatuses) as follows.

Method 1. The frequency-domain coefficient is generated by applying the DFT to the time-domain filter coefficient used for the data symbol transmission, the spectrum shaping is applied to the DMRS by obtaining a multiplication of the DMRS sequence in a tone-by-tone manner, and then the DMRS is mapped to the IFFT.

Method 2. The time-domain sequence is generated by applying the IDFT to the DMRS designed in the frequency domain, the circular convolution is performed with respect to the generated time-domain sequence and the time-domain filter coefficient used for the data symbol transmission, and then the DMRS is mapped to the IFFT by applying again the DFT.

In case of using method 1, the RS generation block 320 of FIG. 3 may perform the corresponding process using the filter coefficient in the spectrum shaping block 310. In this case, a method/apparatus for normalizing the power of the signal is required. If it is assumed that the sum of coefficient powers of the time-domain spectrum shaping filter coefficients as in the mathematical expression 2 or 3 is generally normalized to 1, and the DFT operation is generally normalized so as not to change the input/output power (multiplied by $$\frac{1}{\sqrt{M_{sc}^{PUSCH}}}),$$

the frequency-domain spectrum shaping (FDSS) coefficient, by which the DMRS is multiplied, can be derived as follows.

$$H_{ss}[k] = \sum_{i=0}^{M_{sc}^{PUSCH}-1} h_{ss}[i] \cdot e^{-j\frac{2\pi ik}{M_{sc}^{PUSCH}}} \quad \text{Mathematical expression 9}$$

$$k = 0, \ldots, M_{sc}^{PUSCH} - 1$$

Here, unlike the mathematical expression 5, the reason why the normalization coefficient $$\frac{1}{\sqrt{M_{sc}^{PUSCH}}}$$

is deleted is that in case of the FDSS, a subsequent multiplication is performed in a tone-by-tone manner, and if the sum of the FDSS coefficient powers to be applied to the allocated tone is 1, the sum of the signal powers after the multiplication is normalized to 1, and thus the sum becomes smaller than the sum of the powers of the original transmitted data symbols (in average, the DFT size of $M_{sc}^{PUSCH}$). Accordingly, to prevent this, the sum of powers of the FDSS coefficients Hss[k] should be the DFT size, that is, $$\sum_{k=0}^{M_{sc}^{PUSCH}-1} |H_{ss}[k]^2| = M_{sc}^{PUSCH},$$

rather than 1, and the mathematical expression 9 becomes a generation equation reflecting this.

If the DFT processing of the filter coefficients every time imposes a burden in implementation, output coefficients for each DFT size for the corresponding time-domain filter coefficients may be pre-calculated and stored using a large-capacity memory, and the stored value may be read in accordance with the DFT size allocated by the base station to be multiplied by the DMRS sequence.

If the uplink transmission is performed to two or more logical antenna ports through the precoder even in case of a single layer transmission, the DMRS symbol that is TDM-modulated with the data symbol may be interleaved and transmitted so that the DMRS resource element (RE) to be mapped to each other for each port maintains orthogonality. As an example, the DMRS at port 0 may be mapped to an even subcarrier index among allocated subcarrier resources, and the DMRS at port 1 may be mapped to an odd subcarrier index. In this case, the spectrum shaping may be applied to the DMRS of each port as follows.

$$y'^{(0)}(2k) = H_{ss}[2k] \cdot y^{(0)}(k)$$

$$y'^{(1)}(2k+1) = H_{ss}[2h+1] \cdot y^{(1)}(k)$$

$$k = 0, \ldots, M_{sc}^{PUSCH}/2 - 1 \qquad \text{Mathematical expression 10}$$

That is, the DMRS sequence of each port may be generated as long as a half of the allocated DFT size, may be multiplied by the DMRS of port 0 using the spectrum shaping coefficient of an even index tone, may be mapped to the IFFT of port 0 (zero is inserted into an odd index tone), may be multiplied by the DMRS of port 1 using the spectrum shaping coefficient of the odd index tone, and then may be mapped to the IFFT of port 1 (zero is inserted into the even index tone). In case of the transmission to three or more multi-antenna ports in the same manner, the spectrum shaping rule for the DMRS may be extended. In this case, if the transmission power normalization rule in the mathematical expressions 2, 5, and 9 as described above is observed, the same transmission power as that during the single port transmission can be maintained even in case of the multi-port transmission.

On the other hand, if it is intended to apply the spectrum shaping to the corresponding DMRS in a state where the DMRS for the corresponding port has already been designed to be interleaved at uniform intervals for the multi-port transmission when the terminal intends to perform the single-port data transmission, only the RE engaged with the DMRS in the allocated frequency resource is multiplied by the FDSS coefficient, and the remaining REs engaged for other ports are multiplied by the FDSS coefficient of 0, resulting in that the normalization may not be easy even if the FDSS coefficient is made as in the mathematical expression 9. In this case, the normalization may be performed once more only with respect to the coefficients corresponding to the RE resource engaged for the corresponding port again among $M_{sc}^{PUSCH}$-numbered FDSS coefficients so that the power sum of the coefficients becomes $M_{sc}^{PUSCH}$, the power being reduced at the corresponding rate as much as the interleaving interval as compared with the data symbol power may be compensated for by applying a power control parameter (coefficient) to the DMRS without re-normalization of the FDSS coefficients, or the normalization process may be performed through a combination of the two methods as described above.

In case of using method 2, after the IDFT is applied to the frequency-domain DMRS, the DMRS symbols may be generated by inputting the corresponding output to an input of the spectrum shaping block 310 instead of the output of the modulation block 305 using the data symbol generation block of FIG. 3. If the DMRS IDFT application in real time imposes a burden in implementation, IDFT output values for the frequency-domain DMRS may be pre-calculated and stored in accordance with the frequency resource region location and the DFT size using a large-capacity memory, and the stored value may be read and input to the input of the spectrum shaping block 310 in accordance with the resource scheduling indication of the base station to generate the DMRS symbols.

On the other hand, if the PAPR (about 2 to 5 dB in LTE) of the DMRS symbol for the DFT-s-OFDM becomes larger than the PAPR (about 1 to 3 dB) of the π/2-BPSK DFT-s-OFDM data symbol to which the spectrum shaping is applied even though the base station and the terminal have already known the spectrum shaping coefficient through engagement, linearity of the DMRS symbol having relatively higher PAPR may be destroyed more severely as compared with the linearity of the data symbol due to non-linearity of a power amplifier when the terminal performs uplink transmission in the vicinity of a threshold value of the power amplifier, and this may cause the channel estimation performance to deteriorate during reception by the base station. Even in this case, in the same manner as the π/2-BPSK DFT-s-OFDM data symbol, the base station reception performance can be improved by lowering the PAPR through application of the spectrum shaping even to the DMRS symbol. In this case, since the base station has already known the spectrum shaping coefficient, it can effectively obtain the channel from which the spectrum shaping effect applied to the DMRS through various methods is removed, or may equalize the same using an effective channel to which the spectrum shaping is coupled as if the spectrum shaping coefficient is not known.

If the performance deterioration greatly occurs by the DMRS having the PAPR with relatively high π/2-BPSK DFT-s-OFDM reception performance to which the spectrum shaping is applied using the DMRS designed regardless of the modulation type, the DMRS may be designed and operated, which is specified to the PAPR reduction separately from the DMRS that is used during the high-order modulation transmission, such as QPSK or 16QAM, in case of the π/2-BPSK modulation.

Figure 5:
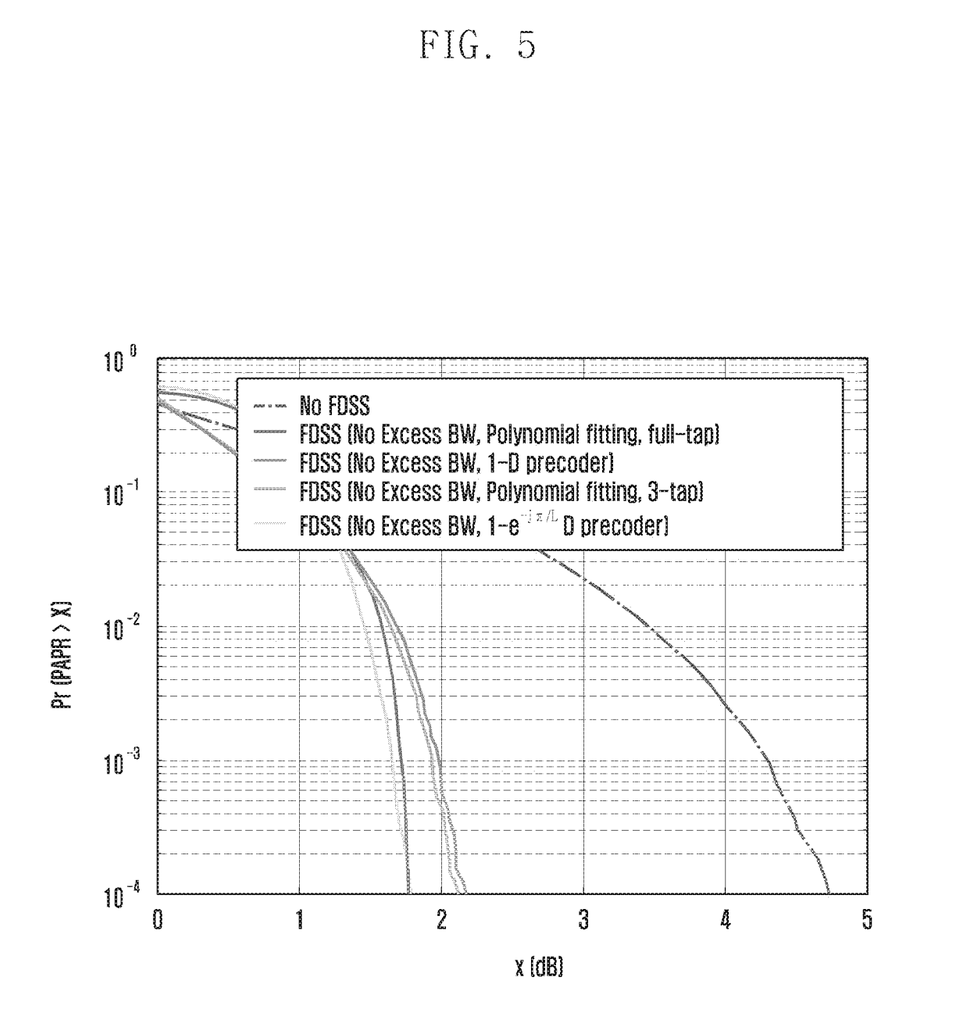
FIG. 5 is a diagram explaining effects according to various embodiments of the disclosure.

FIG. 5 is a diagram explaining effects according to various embodiments of the disclosure.

Referring to FIG. 5, various examples are illustrated of FDSS filtering applied. As illustrated in FIG. 5, FDSS filtering reduces PAPR from 5 dB to 2 dB. Accordingly, FDSS filtering significantly reduces PAPR.

Although embodiments of the disclosure have been described in the specification and drawings, these are merely used as general meanings to assist those of ordinary skill in the art to gain a comprehensive understanding of the disclosure, and do not limit the scope of the disclosure. It will be apparent to those of ordinary skill in the art to which the disclosure pertains that other modifications are possible based on the technical concept of the disclosure in addition to the embodiments disclosed herein. Further, if needed, the respective embodiments may be combined with each other to be operated.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A method for transmitting a signal by a communication device in a wireless communication system, the method comprising:

determining a coefficient used for a time-domain spectrum shaping filter, the coefficient satisfying a predetermined maximum number of filter taps, wherein the predetermined maximum number of filter taps is 2 or 3;

performing a circular convolution of modulated symbols with the coefficient by the time-domain spectrum shaping filter; and transmitting, to a receiving device, the signal based on data symbols processed by the time-domain spectrum shaping filter,
wherein a number of the modulated symbols input to the time-domain spectrum shaping filter is same as a number of the data symbols processed by the time-domain spectrum shaping filter.

2. The method of claim 1, wherein the communication device is a user equipment (UE) and the signal is an uplink signal.

3. The method of claim 1, wherein the coefficient is determined based on at least one of a power normalization, characteristics of a filter coefficient, or dependency on a discrete Fourier transform (DFT) size.

4. The method of claim 3, wherein the characteristics of the filter coefficient corresponds to at least one of a real-symmetric filter, a conjugate-symmetric filter, an equal-gain filter, or a low-pass filter.

5. The method of claim 1,
wherein the time-domain spectrum shaping filter $h_{ss}[i]$ satisfies:

$$h_{ss}[i] = \frac{1}{\sqrt{2}}\delta[i] - \frac{1}{\sqrt{2}}\delta[i-1],$$

and
wherein $\delta[i]$ is a delta function.

6. The method of claim 1,
wherein the time-domain spectrum shaping filter $h_{SS}[i]$ satisfies:

$$h_{ss}[i] = \frac{1}{\sqrt{2}}\delta[i] - \frac{1}{\sqrt{2}}e^{-j\frac{\pi}{M_{SC}^{PUSCH}}}\delta[i-1],$$

wherein $\delta[i]$ is a delta function, and
wherein the $M_{SC}^{PUSCH}$ is a discrete Fourier transform (DFT) size during a physical uplink shared channel (PUSCH) transmission.

7. The method of claim 1, wherein spectrum shaping by the time-domain spectrum shaping filter is applied only during transmission of the π/2-binary phase shift keying (BPSK) discrete Fourier transform-spread-orthogonal frequency division multiplexing (DFT-s-OFDM).

8. The method of claim 1, further comprising:
multiplying each tone of a demodulation reference signal (DMRS) sequence to generate a frequency map; and
applying the frequency map to an inverse fast Fourier transform (IFFT) that corresponds to the DMRS sequence.

9. A communication device for transmitting a signal in a wireless communication system, the communication device comprising:
a transceiver; and
a processor coupled with the transceiver and configured to control to:
determine a coefficient used for a time-domain spectrum shaping filter, the coefficient satisfying a predetermined maximum number of filter taps, wherein the predetermined maximum number of filter taps is 2 or 3,
perform a circular convolution of modulated symbols with the coefficient by the time-domain spectrum shaping filter, and
control the transceiver to transmit, to a receiving device, the signal based on data symbols processed by the time-domain spectrum shaping filter,
wherein a number of the modulated symbols input to the time-domain spectrum shaping filter is same as a number of the data symbols processed by the time-domain spectrum shaping filter.

10. The communication device of claim 9, wherein the communication device is a user equipment (UE) and the signal is an uplink signal.

11. The communication device of claim 9, wherein the coefficient is determined based on at least one of a power normalization, characteristics of a filter coefficient, or dependency on a discrete Fourier transform (DFT) size.

12. The communication device of claim 11, wherein the characteristics of the filter coefficient are associated with at least one of a real-symmetric filter, a conjugate-symmetric filter, an equal-gain filter, or a low-pass filter.

13. The communication device of claim 9, wherein the time-domain spectrum shaping filter $h_{SS}[i]$ satisfies:

$$h_{ss}[i] = \frac{1}{\sqrt{2}}\delta[i] - \frac{1}{\sqrt{2}}\delta[i-1],$$

and
wherein $\delta[i]$ is a delta function.

14. The communication device of claim 9,
wherein the time-domain spectrum shaping filter $h_{SS}[i]$ satisfies:

$$h_{ss}[i] = \frac{1}{\sqrt{2}}\delta[i] - \frac{1}{\sqrt{2}}e^{-j\frac{\pi}{M_{SC}^{PUSCH}}}\delta[i-1],$$

wherein $\delta[i]$ is a delta function, and
wherein the $M_{SC}^{PUSCH}$ is a discrete Fourier transform (DFT) size during a physical uplink shared channel (PUSCH) transmission.

15. The communication device of claim 9, wherein spectrum shaping by the time-domain spectrum shaping filter is applied only during transmission of the π/2-binary phase shift keying (BPSK) discrete Fourier transform-spread-orthogonal frequency division multiplexing (DFT-s-OFDM).

16. The communication device of claim 9, wherein, the processor is further configured to:
multiply each tone of a demodulation reference signal (DMRS) sequence to generate a frequency matrix, and
apply the frequency matrix to an inverse fast Fourier transform (IFFT) that corresponds to the DMRS sequence.

* * * * *